United States Patent [19]

Kalthoff et al.

[11] Patent Number: 5,703,589

[45] Date of Patent: Dec. 30, 1997

[54] SWITCHED CAPACITOR INPUT SAMPLING CIRCUIT AND METHOD FOR DELTA SIGMA MODULATOR

[75] Inventors: Timothy V. Kalthoff; Binan Wang; Miaochen Wu, all of Tucson, Ariz.

[73] Assignee: Burr-Brown Corporation, Tucson, Ariz.

[21] Appl. No.: 611,329

[22] Filed: Mar. 8, 1996

[51] Int. Cl.[6] ........................ H03M 1/12
[52] U.S. Cl. .......... 341/172; 341/143; 341/118
[58] Field of Search ........................ 341/172, 143, 341/155, 150, 118, 119

[56] References Cited

U.S. PATENT DOCUMENTS

| | | | |
|---|---|---|---|
| 4,138,649 | 2/1979 | Schaffer | 330/9 |
| 4,600,901 | 7/1986 | Rabaey | 341/143 |
| 4,633,223 | 12/1986 | Senderowicz | 340/347 |
| 4,939,516 | 7/1990 | Early | 341/143 |
| 4,994,805 | 2/1991 | Dedic et al. | 341/143 |
| 5,001,725 | 3/1991 | Senderowicz et al. | 375/247 |
| 5,012,245 | 4/1991 | Scott et al. | 341/150 |
| 5,159,341 | 10/1992 | McCartney et al. | 341/143 |
| 5,245,344 | 9/1993 | Sooch | 341/150 |
| 5,274,374 | 12/1993 | Powell et al. | 341/143 |
| 5,495,200 | 2/1996 | Kwan et al. | 327/553 |

OTHER PUBLICATIONS

Max W. Hauser and Robert W. Brodersen, "Circuit and Technology Considerations for MOS Delta-Sigma A/D Converters", 1986 IEEE International Symposium on Circuits and Systems, pp. 1310-1315.

Rinaldo Castello and Paul R. Gray, "Performance Limitations in Switched-Capacitor Filters", IEEE Transactions on Circuits and Systems, vol. CAS-32, No. 9 Sep. 1985, pp. 865-876.

Hsieh et al., "A Low-Noise Chopper-Stabilized Differential Switched-Capacitor Filtering Technique", pp. 243-250, Reprinted from IEEE Solid-State Circuits, vol. SC-16, No. 6, pp. 708-715, Dec., 1981.

Gregory L. Schaffer, "A CMOS A/D Converter Circuit for Thermocouple Temperature Measurement", 1981 IEEE International Solid-State Circuits Conference, pp. 60-61.

Enz et al., "A CMOS Chopper Amplifier", IEEE Journal of Solid-State Circuits, vol. SC-22, No. 3, Jun. 1987, pp. 335-342.

Michael C. W. Coln, "Chopper Stabilization of MOS Operational Amplifiers Using Feed-Forward Techniques", IEEE Journal of Solid-State Circuits, vol. SC-16, No. 6, Dec. 1981, pp. 745-748.

J. D. Everard, "A Single Channel Codec", ICC-78 International Conference on Communication, Toronto, Canada (Jun. 4-7, 1978), pp. 45.3.1 to 45.3.5.

"CS5501, Low-Cost, 16-Bit Measurement A/D Converter", Crystal Semiconductor Corporation, Austin, Texas, Feb. 1990, pp.3-279 to 3-316.

*Primary Examiner*—Jeffrey A. Gaffin
*Assistant Examiner*—Jason L. W. Kost
*Attorney, Agent, or Firm*—Cahill, Sutton & Thomas, P.L.C.

[57] ABSTRACT

A switched capacitor input sampling circuit in a chopper stabilized delta sigma modulator includes first and second input terminals adapted to receive a differential analog input voltage therebetween and first and second terminals coupled to first and second charge summing conductors, respectively, of the delta sigma modulator. The switched capacitor input sampling circuit also includes a first switch coupled between the first input terminal and a first conductor, a second switch coupled between the second input terminal and a second conductor, a third switch coupled between the first conductor and a bias voltage conductor, a fourth switch coupled between the second conductor and the bias voltage conductor, a first input capacitor coupled between the first conductor and a third conductor, a second input capacitor coupled between the second conductor and a fourth conductor, a fifth switch coupled between the third and fourth conductors, a sixth switch coupled between the third conductor and the first charge summing conductor, and a seventh switch coupled between the fourth conductor and the second charge summing conductor.

12 Claims, 4 Drawing Sheets

SWITCHED CAPACITOR INPUT SAMPLING CIRCUIT AND METHOD FOR DELTA SIGMA MODULATOR

BACKGROUND OF THE INVENTION

The invention relates to delta sigma modulators and delta sigma analog-to-digital converters, and more particularly to switched capacitor input sampling circuits for delta sigma modulators.

Figure 1:
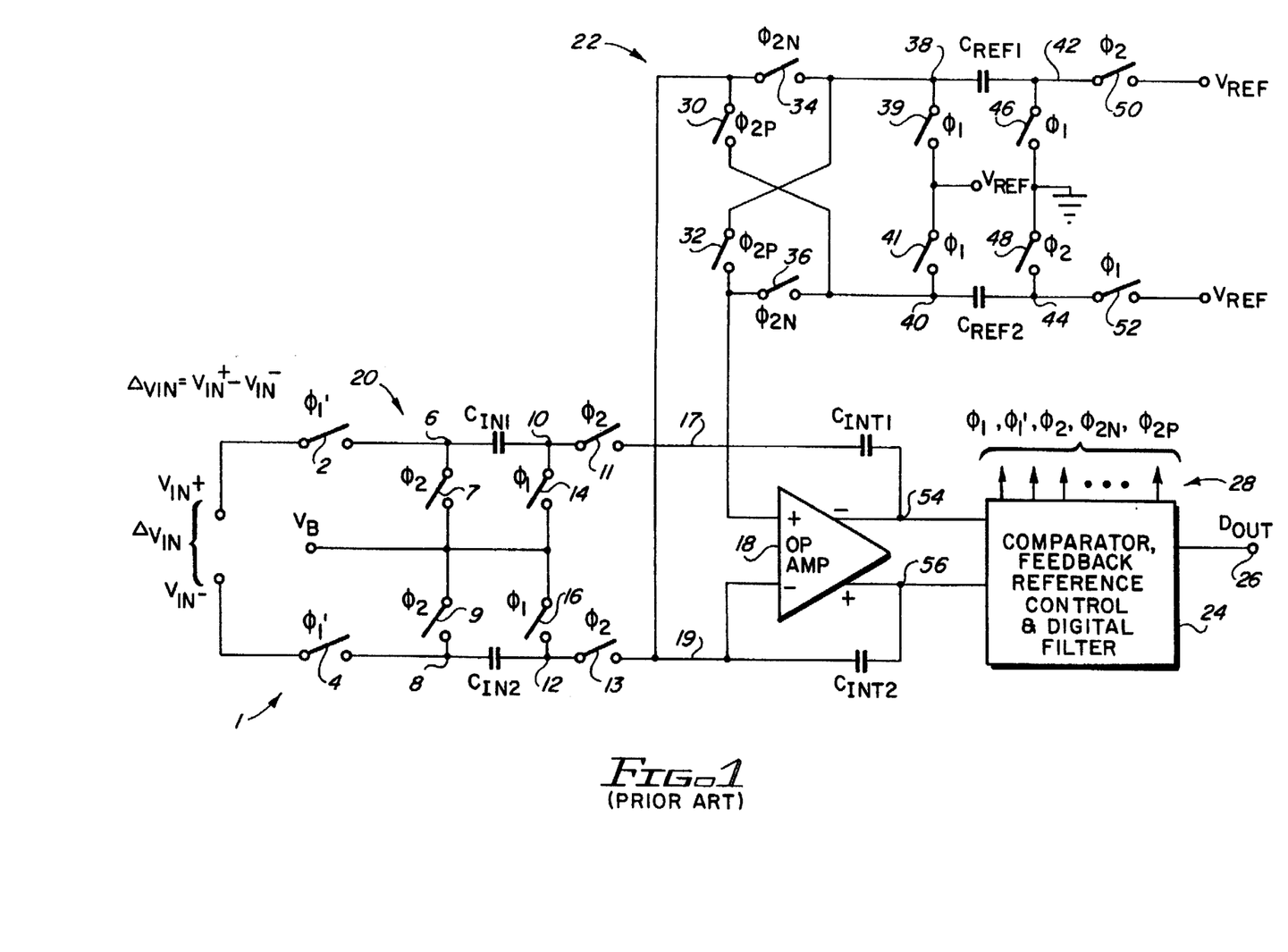
FIG. 1 is a schematic diagram of a prior art delta sigma analog-to-digital converter.

Several definitions are important to understanding of the invention and relevant background information. The term "common mode voltage" as applied to discussion of a delta sigma modulator (such as the prior art delta sigma modulator shown in FIG. 1 and the preferred embodiment of the invention shown in FIGS. 2A and 2B) can be thought of as the average value of $V_{IN}^+$ and $V_{IN}^-$. Referring to FIG. 1, the differential input voltage a $\Delta V_{IN} = V_{IN}^+ - V_{IN}^-$ applied between the input terminals of the delta sigma analog-to-digital converter may have a very small magnitude (i.e., a few millivolts or zero volts), while at the same time the associated common mode voltage $(V_{IN}^+ + V_{IN}^-)/2$ may be quite large, i.e., 4 or 5 volts for a single power supply circuit (or ±4 or ±5 volts for a two power supply circuit).

The term "delta sigma analog-to-digital converter" simply refers to an analog-to-digital converter that includes a delta sigma modulator.

The term "chopper stabilization" refers to a conventional technique that has been used to cancel input offset errors in operational amplifiers and switched capacitor filters, and also to improve performance of delta sigma analog-to-digital converters, for example, as shown in prior art U.S. Pat. No. 4,939,516 (Early). Basically, chopper stabilization is a way of providing an "A phase" during which the differential input $\Delta V_{IN}$ is applied between the + and − inputs of a functional block, such as an operational amplifier, and a subsequent "B phase" during which the various connections to the inputs, and also to the outputs, of the functional block are repetitively "swapped' or reversed.

Referring now to prior art FIG. 1, the first phase (the "sample" phase) of operation is that $V_{IN+}$ and $V_{IN}^-$, the two components of the differential input signal $\Delta V_{IN}$, are sampled onto sampling capacitors $C_{IN1}$ and $C_{IN2}$, respectively, by closing switches 2, 4, 14 and 16, with switches 7, 9, 11 and 13 being left open. Assuming that the bias voltage $V_B$ is zero, i.e., ground, then during such sampling operation the full value of $V_{IN}^+$ (which may be as high as 4 or 5 volts or more) is applied across sampling capacitor $C_{IN1}$. Similarly, the full value of $V_{IN}^-$ (which may be 4 or 5 volts) is applied across sampling capacitor $C_{IN2}$. The foregoing is true even if $\Delta V_{IN}$ is zero, because $V_{IN}^+$ and $V_{IN}^-$ may be at large positive or large negative values of common mode voltage.

The second phase of the prior art circuit operation is called the "transfer phase", during which the "sampled" charges on $C_{IN1}$ and $C_{IN2}$ are "transferred" to integrating capacitors $C_{INT1}$ and $C_{INT2}$, respectively. ($C_{INT1}$ and $C_{INT2}$ together with operational amplifier 18 constitute an integrator.) To accomplish such charge transfer, switches 2, 4, 14 and 16 are opened, and switches 7, 9, 11 and 13 are closed. This causes the sampled charges on $C_{IN1}$ and $C_{IN2}$ to be transferred through switches 11 and 13 and charge summing conductors 17 and 18 into integrating capacitors $C_{INT1}$ and $C_{INT2}$, respectively. (Other aspects of the structure and operation of the circuit of prior art FIG. 1 are not described because they are somewhat irrelevant as background to the improvements which constitute the present invention.)

One shortcoming of the delta sigma analog-to-digital converter 1 shown in prior art FIG. 1 is that the above mentioned common mode voltage (the average of $V_{IN}^+$ and $V_{IN}^-$) is applied between the + and − inputs of operational amplifier 18 during the transfer phase. This common mode voltage is quite large, and can have a magnitude of 4 or 5 volts. This makes the design of the input stage of operational amplifier complex and expensive. Additional differential offset errors will occur as this common mode voltage is impressed on the input stage of the operational amplifier, which has a limited common mode rejection ratio.

Another shortcoming of the prior art circuit of FIG. 1 is that manufacturing mismatches between $C_{IN1}$ and $C_{IN2}$ can cause poor common mode rejection for the analog-to-digital converter, since common mode voltages not equal to $V_B$ will create a differential sampled charge and a common mode sampled charge. The common mode sampled charge is rejected by the differential circuit structure; however, the differential sampled charge due to common mode voltage change remains as an uncancelled error.

Yet another shortcoming of the prior art circuit of FIG. 1 is that since large common mode currents flow into the sampling capacitors $C_{IN1}$ and $C_{IN2}$ during the sample phase, $C_{IN1}$ and $C_{IN2}$ cause delta sigma analog-to-digital converter 1 to have low common mode input impedance. This is undesirable because it undesirably "loads" the source circuit supplying $\Delta V_{IN}$.

Still another shortcoming of the prior art circuit of FIG. 1 is that parasitic capacitances associated with nodes 10 and 12 are likely to be mismatched, and such mismatch results in reduced common mode rejection of the delta sigma modulator, because the common mode voltage is developed across $C_{IN1}$ and $C_{IN2}$ during sampling and then is applied across the mismatched parasitic capacitors of nodes 10 and 12 when switches 7 and 9 are closed. This creates a differential error charge that reduces the common mode rejection. Also, uncancelled capacitor voltage coefficients associated with $C_{IN1}$ and $C_{IN2}$ result in non-linearities in the analog-to-digital conversion process and reduced common mode rejection of the delta sigma analog-to-digital converter 1.

U.S. Pat. No. 4,896,156 (Garverick) discloses a three phase differential delta sigma modulator in which the same sampling capacitors 1 and 2 are stored for sampling the differential input voltage and two reference feedback voltages. A switch 5 is closed during sampling so the sampled signal is applied across the series connection of the sampling capacitors, resulting in high common mode input impedance and avoiding large differential charge errors as a result of mismatches between capacitors 1 and 2. The first of the three phases of the Garverick circuit precharges the sampling capacitors to the two reference feedback voltages, respectively, to establish a common mode bias point for the operational amplifier 6 of the integrator. The use of three phases of operation rather than two as the undesirable effect of substantially reducing the operating speed. The technique of precharging of the sampling capacitor has the undesirable effect of decreasing the differential input impedance of the delta sigma modulator and necessitating use of two power supplies ($+V_R$ and $-V_R$) rather than one.

The circuit of the Garverick patent is more complex in order to allow use of the same sampling capacitor for both the input sampling and reference feedback sampling operations and to achieve resetting of a common mode bias point for the operational amplifier 6 of the differential integrator. Such sharing of the sampling capacitors also necessitates the use of the two feedback reference voltage sources $+V_R$ and $-V_R$, rather than one. The Garverick circuit is subject to input-signal-dependent loading of the reference voltage sources $+V_R$ and $-V_R$ as a function of the differential input voltage. That is, the amount of charge the reference voltage sources have to supply to the sampling capacitors 1 and 2 changes is a function of the applied differential input voltage. That introduces harmonic distortion, because, as a practical matter, the reference voltage sources usually vary as a function of the input sampling as the differential input voltage changes. Furthermore, the sampling capacitors 1 and 2 in the Garverick circuit are always precharged to $+V_R$ and $-V_R$, respectively. Consequently, the differential input signal source must discharge the sampling capacitors 1 and 2 regardless of the magnitude of the applied differential input voltage. Stated differently, there is significant loading on the analog input source, even if the applied differential input voltage is very small. It is very undesirable to have a long input settling time for minute differential input signals applied by a source of moderate impedance. That condition also can create what are called "source referred errors" due to the output impedance of the signal source being loaded during sampling by the input sampling circuit of the delta sigma analog-to-digital converter.

It is highly desirable to provide a delta sigma modulator that provides a high common mode impedance without causing signal-dependent loading of the reference feedback voltage source or sources and without the extra circuit complexity and source-referred signal processing errors caused by the Garverick circuit.

SUMMARY OF THE INVENTION

Accordingly, it is an object of the invention to provide a two-phase switched capacitor input sampling circuit and technique which avoids large common mode voltage swings at the input of an integrator operational amplifier of a delta sigma modulator.

It is another object of the invention to avoid degradation of common mode rejection caused by manufacturing mismatches between the integrating capacitors of a two-phase differential input delta sigma modulator.

It is another object of the invention to provide a high common mode input impedance in a two-phase differential input delta sigma modulator.

It is another object of the invention to avoid non-linearities and degradation of common mode rejection in an inexpensive differential input delta sigma modulator due to mismatched parasitic capacitances in a two-phase switched capacitor input sampling circuit thereof.

It is another object of the invention to reduce or remove low frequency errors such as offset errors, thermal drift errors, and 1/f noise of the operational amplifier of the integrator of a delta sigma modulator and to remove differential charge injection errors of the sampling switches of the delta sigma modulator.

It is another object of the invention to avoid signal-dependent loading of the feedback reference voltage source in a delta sigma modulator.

It is another object of the invention to avoid source-referred errors produced by a delta sigma analog-to-digital converter.

Briefly described, and in accordance with one embodiment thereof, the invention provides an improved switched capacitor input sampling circuit in a delta sigma modulator. The delta sigma modulator includes a switched capacitor feedback reference voltage sampling circuit receiving a reference feedback voltage and having first and second terminals coupled to first and second charge summing conductors. An integrator of the delta sigma modulator includes an amplifier having first and second inputs coupled to the first and second charge summing conductors, respectively, a first integrating capacitor coupled between the first charge summing conductor and a first output of the amplifier, and a second integrating capacitor coupled between the second charge summing conductor and a second output of the amplifier. A comparator and clock generating circuit has at least one input coupled to one of the first and second outputs of the amplifier and generates a plurality of clock signals in accordance with "1" or "0" comparator decisions. The improved switched capacitor input sampling circuit includes first and second input terminals adapted to receiving a differential analog input voltage therebetween and first and second terminals coupled to the first and second charge summing conductors, respectively. The switched capacitor input sampling circuit also includes a first switch coupled between the first input terminal and a first conductor, a second switch coupled between the second input terminal and a second conductor, a third switch coupled between the first conductor and a bias voltage conductor, a fourth switch coupled between the second conductor and the bias voltage conductor, a first sampling capacitor coupled between the first conductor and a third conductor, a second sampling capacitor coupled between the second conductor and a fourth conductor 12, a fifth switch coupled between the third and fourth conductors, a sixth switch coupled between the third conductor and the first charge summing conductor, and a seventh switch coupled between the fourth conductor and the second charge summing conductor. The plurality of clock signals open the third, fourth, sixth and seventh switches and close the first, second, and fifth switches to effectuate sampling the differential analog input voltage across a series connection of the first and second integrating capacitors during a first clock phase. The plurality of signals open the first, second and fifth switches and simultaneously close the third, fourth, sixth and seventh switches to effectuate transfer of sampled charge between the first input capacitor and the first integrating capacitor and to effectuate transfer of sampled charge between the second input capacitor and the second integrating capacitor during a second clock phase. In the described embodiment, the integrator capacitors and are chopper stabilized with respect to the operational amplifier and input sampling circuit, and two additional switches are cross-coupled between the first and second input and the first and second sampling capacitors to, in effect, swap the first and second input terminals in accordance with the effective swapping of input terminals and output terminals of the integrator, in accordance with the chopper stabilization operation.

DETAILED DESCRIPTION OF THE PREFERRED EMBODIMENTS

Commonly assigned patent application "PROGRAMMABLE GAIN FOR DELTA SIGMA ANALOG-TO- DIGITAL CONVERTER" by Miaochen (nmi) Wu, Timothy V. Kalthoff, and Binan (nmi) Wang, Docket No. 0437-A-169, U.S. Ser. No. 08/611,640 filed on Mar. 6, 1996, is incorporated herein by reference.

Figure 2A:
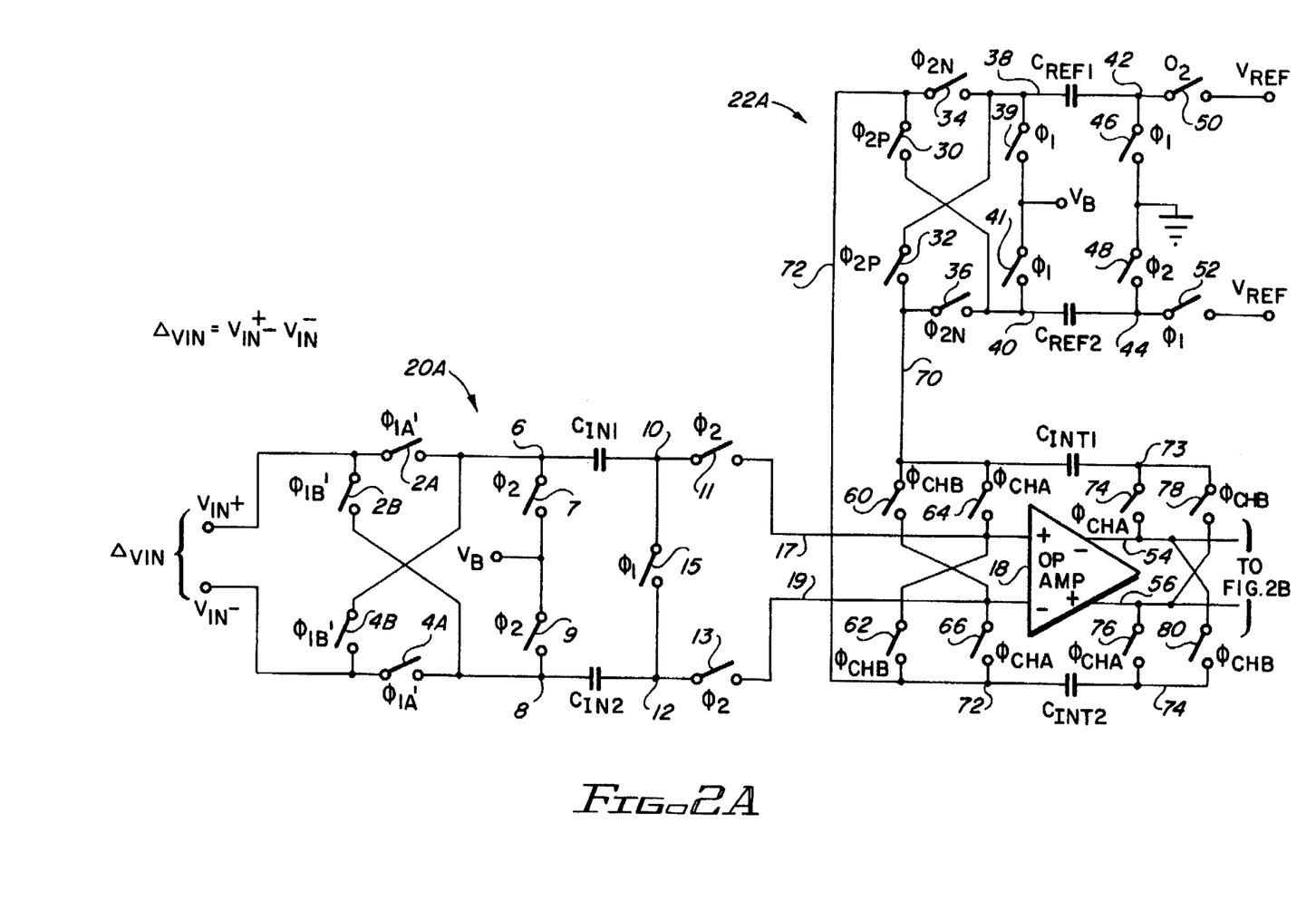
FIGS. 2A and 2B constitutes a schematic diagram of a preferred embodiment of the present invention.
Figure 2B:
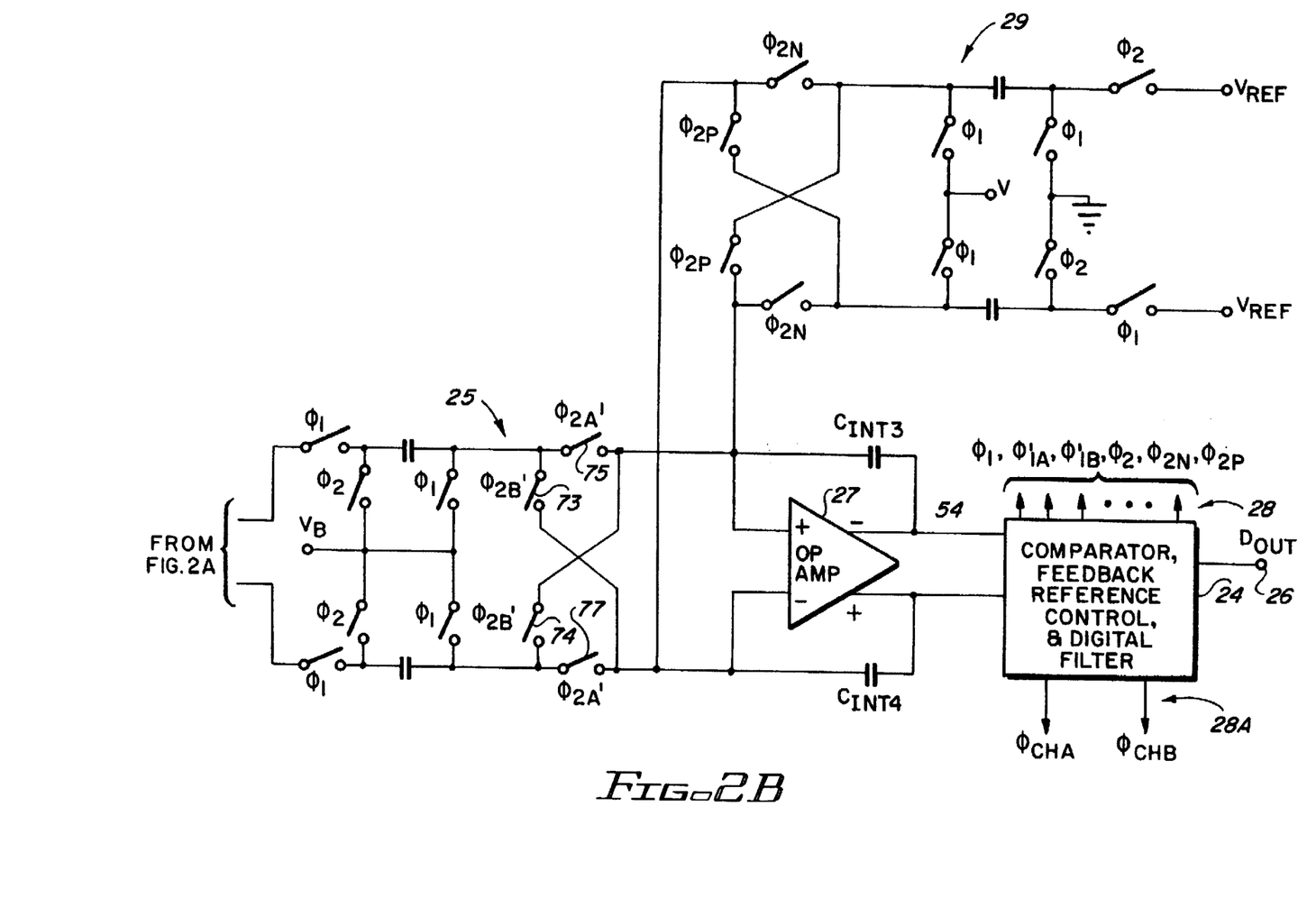

Referring to FIGS. 2A and 2B, delta sigma analog-to-digital converter 1A includes a switched capacitor differential input sampling circuit 20A with a $V_{IN}^+$ input terminal and a $V_{IN}^-$ input terminal, where $\Delta V_{IN}$ is equal to $V_{IN}^+ - V_{IN}^-$. The output terminals of switched capacitor differential input sampling circuit 20A are connected to charge summing conductors 70 and 72, respectively. A switched capacitor feedback reference voltage sampling circuit 22A is connected to exchange feedback charge with charge summing conductors 70 and 72. Charge summing conductors 70 and 72 also are connected to the charge integrating capacitors $C_{INT1}$ and $C_{INT2}$, which are chopper stabilized with respect to operational amplifier 18 input conductors 17 and 19, output conductors 54 and 56, and input sampling circuit conductors 10 and 12.

Figure 2C:
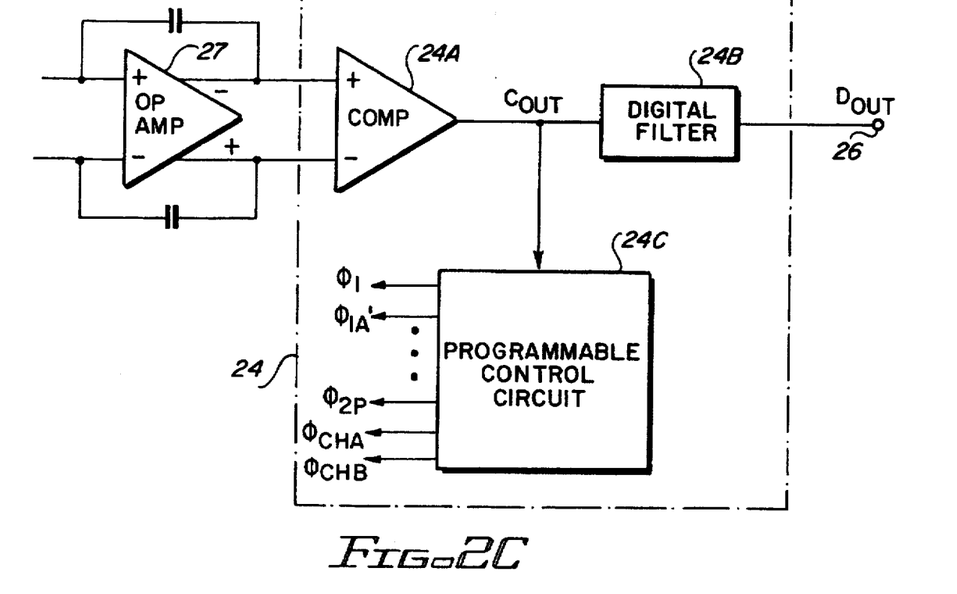
FIG. 2C is a detailed block diagram of block 24 in FIGS. 2A and 2B.

The outputs of operational amplifier 18 are connected to a switched capacitor sampling circuit 25, the outputs of which are connected to an integrator including operational amplifier 27 and integrating capacitors $C_{INT3}$ and $C_{INT4}$. A switched capacitor feedback reference sampling circuit 29 is connected to the inputs of operational amplifier 27, which, in combination with switched capacitor sampling circuits 25 and 29, constitute an analog filter. The outputs of that filter are connected to a circuit 24 which includes a comparator 24A, feedback reference control circuit 24C, and a digital filter 24B as shown in FIG. 2C to produce clock signals $\phi_1$, $\phi_{1A}'$, $\phi_{1B}'$, $\phi_2$, $\phi_{2N}$, $\phi_{2P}$, $\phi_{CHA}$, and $\phi_{CHB}$ in accordance with the timing diagram of FIG. 3 and the feedback decisions of comparator 24A. Digital filter 24C produces the serial digital signal $D_{OUT}$, which accurately represents $\Delta V_{IN}$, on conductor 26.

Switched capacitor input sampling circuit 20A includes switches 2A and 2B coupling the $V_{IN}^+$ terminal to conductors 6 and 8, respectively. Switches 4A and 4B connect $V_{IN}^-$ to conductors 8 and 6, respectively. Switch 7 is coupled between conductor 6 and bias voltage $V_B$, typically 2.5 volts. Switch 9 couples conductor 8 to $V_B$. Sampling capacitor $C_{IN1}$ is connected between conductors 6 and 10. Sampling capacitor $C_{IN2}$ is connected between conductors 8 and 12. Switch 15 is connected between conductors 10 and 12. Switch 11 is connected between conductors 10 and 17. Switch 13 is connected between conductors 12 and 19.

Conductor 17 is connected to the non-inverting input of operational amplifier 18. Conductor 19 is connected to the inverting input of operational amplifier 18. Conductor 17 is connected by switch 64 to conductor 70. Conductor 17 also is connected by switch 62 to conductor 72. Conductor 19 is connected by switch 66 to conductor 72 and by switch 60 to conductor 70. Integrating capacitor $C_{INT1}$ is connected between conductor 70 and conductor 73. Conductor 73 is connected by switch 74 to the inverted output conductor 54 of operational amplifier 18 and by switch 78 to the non-inverted output conductor 56 of operational amplifier 18. Integrating capacitor $C_{INT2}$ is connected between conductor 72 and conductor 74. Conductor 74 is connected by switch 76 to conductor 56 and by switch 80 to conductor 54.

Switched capacitor feedback reference sampling circuit 22A includes switch 34 connected between conductor 72 and conductor 38 and switch 36 connected between conductor 70 and conductor 40. Switch 30 is connected between conductor 72 and conductor 40. Switch 32 is connected between conductor 70 and conductor 38. Switch 39 is connected between conductors 38 and $V_B$. Switch 41 is connected between conductor 40 and $V_B$, which could be equal to $V_{REF}$. Feedback reference sampling capacitor $C_{REF1}$ is connected between conductors 38 and 42. $C_{REF2}$ is connected between conductors 40 and 44. Switch 46 is connected between conductor 42 and ground, and switch 48 is connected between conductor 44 and ground. Switch 50 is connected between conductor 42 and $V_{REF}$, and switch 52 is connected between conductor 44 and $V_{REF}$.

Figure 3:
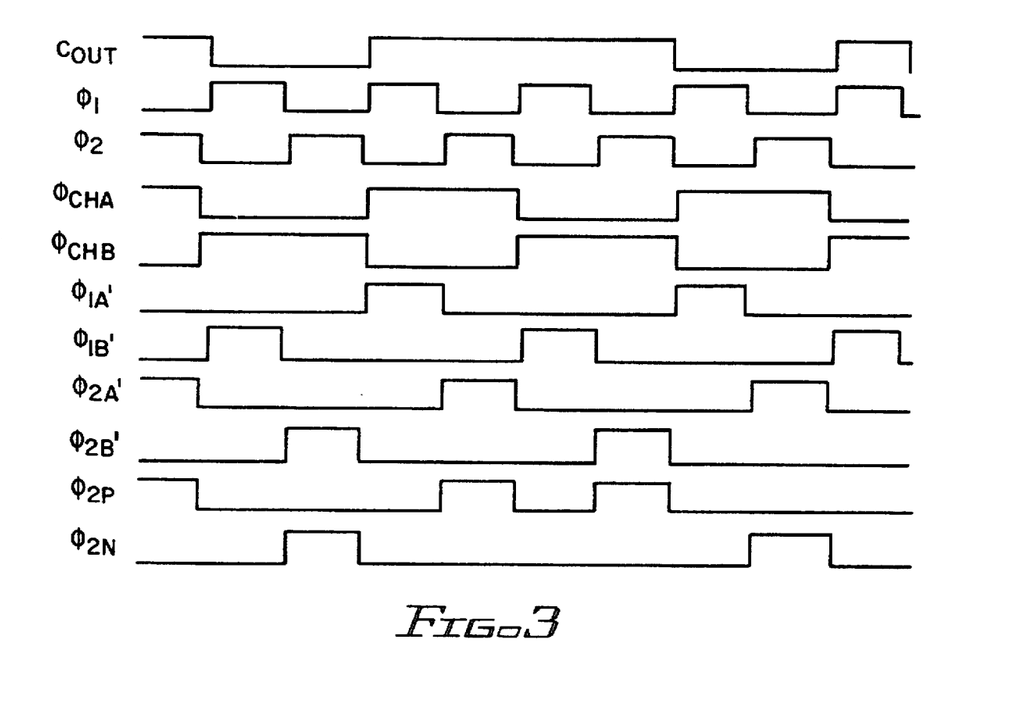
FIG. 3 is a timing diagram useful in describing the operation of the delta sigma analog-to-digital converter of FIGS. 2A and 2B.

The inverted and non-inverted outputs of operational amplifier 18 are connected to a switched capacitor sampling circuit 25 that is similar to switched capacitor input sampling circuit 20A, but is not described in further detail because it is peripheral to the present invention. Switched capacitor circuit 29 is essentially identical to switched capacitor circuit 22A. Operational amplifier 27 and integrating capacitors $C_{INT3}$ and $C_{INT4}$ form an integrator, the outputs of which are connected to above described circuitry 24. The timing diagram of FIG. 3 shows the various clock signals required for operation of FIGS. 2A and 2B as generated by circuit 24, depending upon the decisions of comparator 24A (FIG. 2C) receiving the output of operational amplifier 27.

The clock signals $\phi_{CHA}$ and $\phi_{CHB}$ effectuate the chopper stabilization. Switches 64, 66, 74, and 76 are controlled by $\phi_{CHA}$ and are closed when $\phi_{CHA}$ is "high". Switches 60, 62, 78, and 80 are controlled by $\phi_{CHB}$, and are closed when $\phi_{CHB}$ is "high". Switches 2A and 4A are controlled by $\phi_{1A}'$ and are closed when $\phi_{1A}'$ is "high". Switches 2B and 4B are closed when $\phi_{1B}$ is "high". Switches 7, 9, 11 and 31 and also switches 50 and 52 are closed when $\phi_2$ is "high". Switches 15, 39, 41, 46, and 48 are closed when $\phi_1$ is "high". In general, each switch shown in FIGS. 2A and 2B is controlled by the clock pulse shown adjacent to that switch.

Note that the portions of FIGS. 2A and 2B designated by reference numerals 2B, 4B, 15, 60, 62, 64, 66, 74, 76, 78 and 80 constitute the main differences between the prior art circuit of FIG. 1 and the embodiment of the invention shown in FIGS. 2A and 2B.

The delta sigma analog-to-digital converter 1A of FIGS. 2A and 2B is chopper stabilized. During a "phase A" of the chopper stabilization operation, $\phi_{CHA}$ of FIG. 3 is at a "high" level. $\phi_1$ and $\phi_{1A}'$ also are "high" for sampling of $\Delta V_{IN}$ that occurs during "phase A". Therefore, switches 2A, 4A, and 15 are closed for sampling of $\Delta V_{IN}$ that occurs during "phase A". During "phase A", $\phi_{CHB}$ and $\phi_{1B}'$ are "low". $\phi_2$ is "low" and therefore switches 2B, 4B, 7, 9, 11, and 13 are open for sampling of $\Delta V_{IN}$ during "phase A".

For "transferring" of the sampled charge during "phase A", $\phi_1$ and $\phi_{1A}'$ are "low" and $\phi_2$ is "high". Therefore, switches 7, 9, 11, and 13 are closed and switches 2A, 2B, 4A, and 4B, and 15 are open for transfer of sampled charge between sampling capacitor $C_{IN1}$ and integrating capacitor $C_{INT1}$ and transfer of sampled charge between sampling capacitor $C_{IN2}$ and integrating capacitor $C_{INT2}$.

Similarly, during a "phase B" of the chopper stabilization operation, $\phi_{CHB}$ of FIG. 3 is at a "high" level. $\phi_1$ and $\phi_{1B}'$ also are "high" for sampling of $\Delta V_{IN}$ that occurs during "phase B". Therefore, switches 2B, 4B, and 15 are closed for sampling of $\Delta V_{IN}$ that occurs during "phase B". During "phase B", $\phi_{CHA}$ and $\phi_{1A}'$ are "low". $\phi_2$ is "low" and therefore switches 2A, 4A, 7, 9, 11, and 13 are open for sampling of $\Delta V_{IN}$ during "phase B".

For "transferring" of the sampled charge during "phase B", $\phi_1$ and $\phi_{1A}'$ are "low" and $\phi_2$ is "high". Therefore, switches 7, 9, 11, and 13 are closed and switches 2A, 2B, 4A, and 4B, and 15 are open for transfer of sampled charge between sampling capacitor $C_{IN1}$ and integrating capacitor $C_{INT1}$ and transfer of sampled charge between sampling capacitor $C_{IN2}$ and integrating capacitor $C_{INT2}$.

Thus, the effect of the sequential "phase A" and "phase B" of the chopper stabilization is to reverse or swap the connections of $V_{IN}^+$ and $V_{IN}^-$ to the input of the integrator and to also reverse or swap the connections of the integrating capacitors $C_{INT1}$ and $C_{INT2}$ between the + and − inputs and also between the + and − outputs of operational amplifier 18. However, the basic "sampling" and charge "transferring" operations are the same as if chopper stabilization were not being used. The above portion of the chopper stabilization operation can be thought of as the "chopping" portion of the chopper stabilization associated with $\Delta V_{IN}$, and the corresponding operation of switches 73 and 74 according to $\phi_{2B'}$ and switches 75 and 77 according to $\phi_{2A}'$ can be thought of as the "unchopping" portion of the chopper stabilization operation. Note that the "unchopping" also could occur elsewhere in the circuit, for example at the output of the operational amplifier 18.

In FIGS. 2A and 2B, delta sigma analog-to-digital converter 1A includes an input capacitive switching circuit 20A that receives a differential input $\Delta V_{IN} = V_{IN}^+ - V_{IN}^-$ which is applied to the inputs of capacitive switching circuit 20A. During the "sample" phase, the differential input voltage $\Delta V_{IN}$ then is applied across the series connection of input sampling capacitors $C_{IN1}$ and $C_{IN2}$, either through switches 2A and 4A or 2B and 4B.

According to the invention shown in FIGS. 2A and 2B, only the differential voltage $\Delta V_{IN}$ appears across $C_{IN1}$ and $C_{IN2}$, and, regardless of the value of the common mode input voltage, $\Delta V_{IN}$ is the only voltage applied across the series combination of $C_{IN1}$ and $C_{IN2}$.

During the "transfer phase" of operation, switches 2A, 2B, 4A, 4B and 15 of FIGS. 2A and 2B, are open, and switches 7, 9, 11 and 13 are closed. The charges resulting from the value of $\Delta V_{IN}$ sampled across $C_{IN1}$ and $C_{IN2}$ during the sampling phase are thereby transferred via switches 11 and 13 into the + and − inputs of operational amplifier 18.

Therefore, the sampled charges on $C_{IN1}$ and $C_{IN2}$ are transferred to integrating capacitors $C_{INT1}$ and $C_{INT2}$, respectively.

The foregoing two paragraphs describe the sampling and charge transfer operations of the circuit of FIGS. 2A and 2B during the "phase A" of a chopper stabilization cycle. Description of the operation is similar for the "phase B" of the chopper stabilization cycle, except that the letter "A" would be replaced by "B" in the numerals which designate the various switches.

A major advantage of the structure of FIGS. 2A and 2B is that the common mode voltage associated with $\Delta V_{IN}$ is not applied to the + and − inputs of operational amplifier 18 during the transfer operation. This makes the design of the input stage of operational amplifier less complex and expensive, since it does not need to accommodate a large common mode voltage swing.

Another major advantage of the structure shown in FIGS. 2A and 2B is that since the common mode voltage associated with $\Delta V_{IN}$ is not applied across sampling capacitors $C_{IN1}$ and $C_{IN2}$, there is no common mode current input to the delta sigma modulator analog-to-digital converter 1A of FIGS. 2A and 2B. Consequently, the common mode input impedance of the circuit of FIGS. 2A and 2B is very high. (This is in contrast with the prior art circuit of FIG. 1, in which a common mode current flows into sampling capacitors $C_{IN1}$ and $C_{IN2}$ to charge them up to the common mode voltage during each sample cycle. The flow of this common mode input current into $C_{IN1}$ and $C_{IN2}$ results in a low common mode input impedance in the prior art circuit of FIG. 1.) Note that the common mode voltage does not create differential charge errors due to mismatches of $C_{IN1}$ and $C_{IN2}$.

Also, since the common mode voltage is never applied to the inputs of operational amplifier 18, the common mode rejection of the delta sigma analog-to-digital converter 1A of FIGS. 2A and 2B is higher than is the case for the prior art circuit of FIG. 1.

The use of well known chopper stabilization techniques causes improved common mode rejection of the circuit in FIGS. 2A and 2B relative to the prior art circuit of FIG. 1. The use of switch 15 coupled between conductors 10 and 12 also results in improved linearity by offsetting the effects of non-linear capacitor voltage coefficients of sampling capacitors $C_{IN1}$ and $C_{IN2}$. Use of the single switch 15 between conductors 10 and 12 in combination with chopper stabilization as described removes the effects of mismatches between the parasitic capacitances on conductors 10 and 12.

It should be appreciated that conductors 17 and 19 remain approximately at the value of $V_B$ because in switched capacitor feedback reference circuit 22A, $V_B$ is applied to capacitances (which can be parasitic or non-parasitic) on conductors 38 and 40 during $\phi_1$. That creates a common mode bias voltage which then is transferred to capacitances of or on conductors 17 and 19, and also, during $\phi_2$, to conductors 10 and 12. However, there are various other ways to maintain a common mode bias point for the input sampling circuit 20A so that such common mode bias voltage does not cause problems in the switching operation of the circuit.

The above described switched capacitor circuits sample the analog input and then transfer sampled charges between the sampling capacitors and the integrating capacitors. In each case, the transfer of sampled charge can be thought of as either a "give" transfer of charge from a sampling capacitor to an integrating capacitor or a "take" transfer of charge from an integrating capacitor to a sampling capacitor. It should be appreciated that various other suitable switched capacitor circuits and reference voltages, (for example as shown in the above corresponding application incorporated herein by reference), can be readily adapted such that a particular such circuit always functions to produce a "give" charge transfer, always functions to produce a "take" charge transfer, or performs both "give" and "take" charge transfers functions, depending on the output decision of comparator 24A in block 24.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

For example, the reference feedback circuit 22A shown in FIGS. 2A and 2B could provide its feedback charge directly into the + and − inputs of operational amplifier 18, just as input sampling circuit 20A does. Various other chopper stabilization techniques and circuits than those shown could be used.

What is claimed is:

1. In a delta sigma modulator including i. a switched capacitor feedback reference voltage sampling circuit receiving a reference feedback voltage and having first and second terminals coupled to first and second charge summing conductors, respectively, ii. an integrator including an amplifier having first and second inputs coupled to the first and second charge summing conductors, respectively, a first integrating capacitor coupled between the first charge summing conductor and a first output of the amplifier and a second integrating capacitor coupled between the second charge summing conductor and a second output of the amplifier, iii. a comparator circuit having at least one input coupled to one of the first and second outputs of the amplifier, iv. a clock generating circuit adapted to generate a plurality of clock signals in accordance with "1" or "0" output signal levels produced by the comparator, the improvement comprising in combination:

a switched capacitor input sampling circuit having first and second input terminals adapted to receive a differential analog input voltage therebetween and first and second terminals coupled to the first and second charge summing conductors, respectively, the switched capacitor input sampling circuit including (a) a first switch coupled between the first input terminal and a first conductor, and a second switch coupled between the second input terminal and a second conductor;

(b) a third switch coupled between the first conductor and a bias voltage conductor, and a fourth switch coupled between the second conductor and the bias voltage conductor;

(c) a first sampling capacitor coupled between the first conductor and a third conductor, and a second sampling capacitor coupled between the second conductor and a fourth conductor;

(d) a fifth switch coupled between the third and fourth conductors; and (e) a sixth switch coupled between the third conductor and the first terminal, and a seventh switch coupled between the fourth conductor and the second terminal, the plurality of clock signals opening the third, fourth, sixth and seventh switches and closing the first, second, and fifth switches to effectuate sampling the differential analog input voltage across a series connection of the first and second sampling capacitors during a first clock phase, the plurality of clock signals opening the first, second and fifth switches and closing the third, fourth, sixth and seventh switches to effectuate transfer of sampled charge between the first sampling capacitor and the first integrating capacitor and to effectuate transfer of sampled charge between the second sampling capacitor and the second integrating capacitor during a second clock phase.

2. In a delta sigma modulator, the improvement of claim 1 including chopper stabilization circuitry, a portion of the chopper stabilization circuitry including an eighth switch coupled between the first input terminal and the second conductor, and a ninth switch coupled between the second input terminal and the first conductor, another portion of the chopper stabilization circuitry including a tenth switch coupled between the first charge summing conductor and the first terminal, and an eleventh switch coupled between the second charge summing conductor and the second terminal, a twelfth switch coupled between the first integrating capacitor and the first output of the amplifier, a thirteenth switch coupled between the second integrating capacitor and the second output of the amplifier, a fourteenth switch coupled between the first charge summing conductor and the second terminal, a fifteenth switch coupled between the second charge summing conductor and the first terminal, a sixteenth switch coupled between the first integrating capacitor and the second output of the amplifier, and a seventeenth switch coupled between the second integrating capacitor and the first output of the amplifier, the first, second, tenth, eleventh, twelfth, and thirteenth switches being closed during at least a portion of a first phase of a chopper stabilization cycle, and the eighth, ninth, fourteenth, fifteenth, sixteenth, and seventeenth switches being closed during at least a portion of a second phase of the chopper stabilization cycle.

3. In a delta sigma modulator, the improvement of claim 2 wherein the amplifier is an operational amplifier.

4. In a delta sigma modulator, the improvement of claim 3 wherein the first and second outputs of the first operational amplifier are coupled to first and second inputs of a filter circuit having at least one output coupled to the one input of the comparator circuit.

5. A delta sigma modulator comprising in combination:

(a) a switched capacitor feedback reference voltage sampling circuit receiving a reference feedback voltage and having first and second terminals coupled to first and second charge summing conductors;

(b) an integrator including an amplifier having first and second inputs coupled to the first and second charge summing conductors, respectively, a first integrating capacitor coupled between the first charge summing conductor and a first output of the amplifier and a second integrating capacitor coupled between the second charge summing conductor and a second output of the amplifier;

(c) a comparator circuit having at least one input coupled to one of the first and second outputs of the amplifier;

(d) a clock generating circuit adapted to generate a plurality of clock signals in accordance with "1" or "0" output signal levels produced by the comparator; and (e) a switched capacitor input sampling circuit having first and second input terminals adapted to receive a differential analog input voltage therebetween and first and second terminals coupled to the first and second charge summing conductors, respectively, the switched capacitor input sampling circuit including i. a first switch coupled between the first input terminal and a first conductor, and a second switch coupled between the second input terminal and a second conductor, ii. a third switch coupled between the first conductor and a bias voltage conductor, and a fourth switch coupled between the second conductor and the bias voltage conductor, iii. a first sampling capacitor coupled between the first conductor and a third conductor, and a second sampling capacitor coupled between the second conductor and a fourth conductor, iv. a fifth switch coupled between the third and fourth conductors, and v. a sixth switch coupled between the third conductor and the first terminal, and a seventh switch coupled between the fourth conductor and the second terminal.

6. The delta sigma modulator of claim 5 including chopper stabilization circuitry, a portion of the chopper stabilization circuitry including an eighth switch coupled between the first input terminal and the second conductor, and a ninth switch coupled between the second input terminal and the first conductor, another portion of the chopper stabilization circuitry including a tenth switch coupled between the first charge summing conductor and the first terminal, and an eleventh switch coupled between the second charge summing conductor and the second terminal, a twelfth switch coupled between the first integrating capacitor and the first output of the amplifier, a thirteenth switch coupled between the second integrating capacitor and the second output of the amplifier, a fourteenth switch coupled between the first charge summing conductor and the second terminal, a fifteenth switch coupled between the second charge summing conductor and the first terminal, a sixteenth switch coupled between the first integrating capacitor and the second output of the amplifier, and a seventeenth switch coupled between the second integrating capacitor and the first output of the amplifier, the first, second, tenth, eleventh, twelfth, and thirteenth switches being closed during at least a portion of a first clock phase of a chopper stabilization cycle, and the eighth, ninth, fourteenth, fifteenth, sixteenth, and seventeenth switches being closed during at least a portion of a second phase of the chopper stabilization cycle.

7. The delta sigma modulator of claim 6 wherein the amplifier is an operational amplifier.

8. The delta sigma modulator of claim 7 wherein the first and second outputs of the first operational amplifier are coupled to first and second inputs of a filter circuit having at least one output coupled to the one input of the comparator circuit.

9. In a delta sigma modulator including a switched capacitor feedback reference voltage sampling circuit, an integrator including an amplifier and first and second integrating capacitors, a comparator, a clock generating circuit adapted to generate a plurality of clock signals in accordance with "1" or "0" output signal levels produced by the comparator, the improvement comprising in combination:

a switched capacitor input sampling circuit having first and second input terminals adapted to receive a differential analog input voltage therebetween and first and second terminals coupled to the first and second integrating capacitors, respectively, the switched capacitor input sampling circuit including (a) a first switch coupled between the first input terminal and a first conductor, and a second switch coupled between the second input terminal and a second conductor;

(b) a third switch coupled between the first conductor and a bias voltage conductor, and a fourth switch coupled between the second conductor and the bias voltage conductor;

(c) a first sampling capacitor coupled between the first conductor and a third conductor, and a second sampling capacitor coupled between the second conductor and a fourth conductor;

(d) a fifth switch coupled between the third and fourth conductors; and (e) a sixth switch coupled between the third conductor and the first terminal, and a seventh switch coupled between the fourth conductor and the second terminal, the plurality of clock signals opening the third, fourth, sixth and seventh switches and closing the first, second, and fifth switches to effectuate sampling the differential analog input voltage across a series connection of the first and second sampling capacitors during a first clock phase, the plurality of clock signals opening the first, second and fifth switches and closing the third, fourth, sixth and seventh switches to effectuate transfer of sampled charge between the first sampling capacitor and the first integrating capacitor and to effectuate transfer of sampled charge between the second sampling capacitor and the second integrating capacitor during a second clock phase.

10. In a delta sigma modulator, the improvement of claim 9 including chopper stabilization circuitry, a portion of the chopper stabilization circuitry including an eighth switch coupled between the first input terminal and the second conductor, and a ninth switch coupled between the second input terminal and the first conductor, another portion of the chopper stabilization circuitry including a tenth switch coupled between a first charge summing conductor coupled to the first integrating capacitor and the first terminal, and an eleventh switch coupled between a second charge summing conductor coupled to the second integrating capacitor and the second terminal, a twelfth switch coupled between the first integrating capacitor and the first output of the amplifier, a thirteenth switch coupled between the second integrating capacitor and the second output of the amplifier, a fourteenth switch coupled between the first charge summing conductor and the second terminal, a fifteenth switch coupled between the second charge summing conductor and the first terminal, a sixteenth switch coupled between the first integrating capacitor and the second output of the amplifier, and a seventeenth switch coupled between the second integrating capacitor and the first output of the amplifier, the first, second, tenth, eleventh, twelfth, and thirteenth switches being closed during at least a portion of a first phase of a chopper stabilization cycle, and the eighth, ninth, fourteenth, fifteenth, sixteenth, and seventeenth switches being closed during at least a portion of a second phase of the chopper stabilization cycle.

11. In a delta sigma modulator including a switched capacitor feedback reference voltage sampling circuit, an integrator including an amplifier and first and second integrating capacitors, a comparator, a clock generating circuit adapted to generate a plurality of clock signals in accordance with "1" or "0" output signal levels produced by the comparator, the improvement comprising in combination:

a switched capacitor input sampling circuit having first and second input terminals adapted to receive a differential analog input voltage therebetween and first and second terminals coupled to the first and second integrating capacitors, respectively, the switched capacitor input sampling circuit including (a) a first switch coupled between the first input terminal and a first conductor, and a second switch coupled between the second input terminal and a second conductor;

(b) a third switch coupled between the first conductor and a bias voltage conductor, and a fourth switch coupled between the second conductor and the bias voltage conductor;

(c) a first sampling capacitor coupled between the first conductor and a third conductor, and a second sampling capacitor coupled between the second conductor and a fourth conductor 12;

(d) a fifth switch coupled between the third and fourth conductors; and (e) means coupled to the first and second conductors for establishing an input common mode bias point for the amplifier without precharging either of the first and second conductors to any predetermined reference voltage.

12. In a delta sigma modulator, the improvement of claim 11 further including means coupled to the third and fourth conductors for restoring the third and fourth conductors to the input common mode bias point prior to a subsequent sampling cycle without precharging either of the third and fourth conductors to any predetermined reference voltage.

* * * * *